United States Patent

Chen et al.

[11] Patent Number: 5,917,749
[45] Date of Patent: Jun. 29, 1999

[54] MRAM CELL REQUIRING LOW SWITCHING FIELD

[75] Inventors: Eugene Chen, Gilbert; Saied N. Tehrani, Tempe, both of Ariz.

[73] Assignee: Motorola, Inc., Schaumburg, Ill.

[21] Appl. No.: 08/862,898

[22] Filed: May 23, 1997

[51] Int. Cl.$^6$ .................................................. G11C 11/15
[52] U.S. Cl. .......................................... 365/173; 365/171
[58] Field of Search ..................................... 365/173, 171

[56] References Cited

U.S. PATENT DOCUMENTS

| | | | |
|---|---|---|---|
| 3,573,760 | 4/1971 | Chang et al. | 365/173 |
| 5,650,958 | 7/1997 | Gallagher et al. | 365/173 |
| 5,766,743 | 6/1998 | Fujikata et al. | 428/212 |

Primary Examiner—David Nelms
Assistant Examiner—M. Tran
Attorney, Agent, or Firm—Eugene A. Parsons; William E. Koch

[57] ABSTRACT

A low switching field multi-state, multi-layer magnetic memory cell including two layers of magnetic material stacked in parallel, overlying relationship and separated by a layer of non-magnetic material so as to form a portion of a multi-layer magnetic memory cell. The two layers of magnetic material being formed so that the width is less than the length and less than a width of magnetic domain walls within the two layers of magnetic material, setting a shape anisotropy easy axis along the length thereof. At least one of the two layers of magnetic material having a magnetic anisotropy generally parallel to the width of the layers of magnetic material.

8 Claims, 1 Drawing Sheet

MRAM CELL REQUIRING LOW SWITCHING FIELD

FIELD OF THE INVENTION

The present invention pertains to magnetic memory cells and more specifically to magnetic memory cells utilizing a giant magnetoresistive (GMR) ratio to sense the states.

BACKGROUND OF THE INVENTION

In the past, a variety of magnetic materials and structures have been utilized to form magnetoresistive materials for non-volatile memory elements, read/write heads for disk drives, and other magnetic type applications. One prior magnetoresistive element utilized a magnetoresistive material that has two magnetic layers separated by a conductor layer. The magnetization vectors of the two magnetic layers typically are anti-parallel to each other in the absence of any magnetic fields. The magnetization vectors of one of the layers points in one direction and the magnetization vector of the other layer always points in the opposite direction. The magnetic characteristics of such magnetic materials typically require a width greater than one micron in order to maintain the orientation of the magnetization vectors along the width of the cell. The large width requirement limits the density of memories utilizing such materials.

Another type of memory cell uses multi-layer giant magnetoresistive materials (GMR) and utilizes dimensions around one micron, in order to increase density. A conductive layer is again disposed between the multi-layers of magnetic material. In this structure the magnetization vectors are parallel to the length of the magnetic material instead of the width. In one embodiment the magnetization vector of one magnetic layer is always maintained in one direction while the magnetization vector of the second magnetic layer switches between parallel and antiparallel to the first vector in order to represent both logical "0" and "1" states. This structure is commonly referred to as a spin valve structure. In another embodiment the magnetization vectors of both magnetic material layers are always maintained in the same direction, with opposite vector directions representing logical "0" and "1" states.

Still another type of memory cell uses multi-layer giant magnetoresistive materials (GMR) and also utilizes dimensions around one micron, in order to increase density. In this type of cell a non-conductive layer is disposed between the multi-layers of magnetic material. The magnetization vectors are again parallel to the length of the magnetic material instead of the width but sense current tunnels through the non-conducting layer from one layer of magnetic material to the other, rather than being conducted lengthwise. This structure is commonly referred to as a tunneling GMR cell.

A magnetic random access memory (MRAM) is a non-volatile memory which basically includes a GMR cell, a sense line, and a word line. The MRAM employs the GMR effect to store memory states. Magnetic vectors in one or all of the layers of GMR material are switched very quickly from one direction to an opposite direction when a magnetic field is applied to the GMR cell over a certain threshold. According to the direction of the magnetic vectors in the GMR cell, states are stored, and the GMR cell maintains these states even without a magnetic field being applied. The states stored in the GMR cell can be read by passing a sense current through the cell in a sense line and sensing the difference between the resistances (GMR ratio) when one or both of the magnetic vectors switch. The problem is that in most GMR cells the magnetic field required to switch the states of the cell is relatively high, which means that relatively high switching current is required and substantial power is expended. This increase in current, or magnetic field, can result in a substantial operating power increase, especially in large arrays of GMR cells.

Accordingly, it is highly desirable to provide magnetic random access memories and memory cells with magnetic switching field requirements and without substantially altering the GMR ratio or other characteristics.

It is a purpose of the present invention to provide a new and improved magnetic memory cell with decreased magnetic switching field.

It is another purpose of the present invention to provide a new and improved magnetic memory which will consume less power for both reading and writing operations.

SUMMARY OF THE INVENTION

The above problems and others are at least partially solved and the above purposes and others are realized in a low switching field multi-state, multi-layer magnetic memory cell including two layers of magnetic material stacked in parallel, overlying relationship and separated by a layer of non-magnetic material so as to form a portion of a multi-layer magnetic memory cell. The two layers of magnetic material are formed so that the width is less than the length and less than a width of magnetic domain walls within the two layers of magnetic material, setting a shape anisotropy easy axis along the length thereof. Also, at least one of the two layers of magnetic material has a magnetic anisotropy generally parallel to the width of the layers of magnetic material.

In the low switching field multi-state, multi-layer magnetic memory cell, the cell is formed with a shape anisotropy generally described by the expression $K_D \sin^2\theta$ and a magnetic anisotropy generally described by the expression $-K_m \sin^2\theta$, where $K_m$ is a magnetic anisotropy energy density, $K_D$ is a demagnetization energy density, $\theta$ is an angle between the shape anisotropy easy axis and the magnetization vector. Setting the easy axis of magnetic anisotropy approximately perpendicular to that of the shape anisotropy causes the magnetic anisotropy to subtract from the shape anisotropy and reduce the cell switching field.

BRIEF DESCRIPTION OF THE DRAWINGS

Referring to the drawings.

DESCRIPTION OF THE PREFERRED EMBODIMENTS

Figure 1:
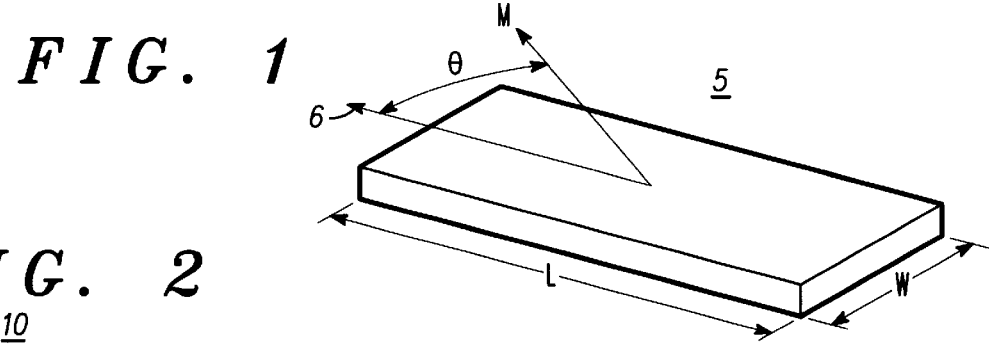
FIG. 1 is a simplified, greatly enlarged isometric view of a single layer of magnetic material with decreased magnetic switching field in accordance with the present invention.

Turning now to the drawings, FIG. 1 illustrates, a simplified, greatly enlarged isometric view of a single layer 5 of magnetic material with decreased magnetic switching field in accordance with the present invention. Layer 5 is generally rectangularly shaped for convenience of this explanation and is formed with the easy axis of magnetization, represented by magnetic vector 6, along the length L and not along the width W. That is, the shape anisotropy easy axis is along the length L, which feature is accomplished by forming the width W smaller than length L and also smaller than the width of the magnetic domain walls or transition width within layer 5. Consequently, magnetic vector 6 cannot be parallel to width W. Typically, widths of less than 1.0 to 1.2 microns result in such a constraint. Width W is generally less than one micron and is as small as can be made by manufacturing technology, and length L is greater than width W, generally five times or more.

The shape anisotropy of layer 5, represented by magnetic vector 6, is generally described by the expression $K_d \sin^2\theta$, and the magnetic anisotropy, represented by vector M, is generally described by the expression $-K_m \sin^2\theta$. In these expressions, $K_m$ is a magnetic anisotropy energy density, $K_D$ is a demagnetization energy density, $\theta$ is an angle between the shape anisotropy easy axis and the magnetization vector. It should be noted that $K_m$ and $K_D$ are constants which are dependent upon the type of material utilized in layer 5. Also, the magnetic field required to switch magnetic vector 6 from the position illustrated to a position rotated 180°, is proportional to an energy barrier expressed generally as $K_d \sin^2\theta - K_m \sin^2\theta$. Setting the easy axis of magnetic anisotropy approximately perpendicular to that of the shape anisotropy causes the magnetic anisotropy to subtract from the shape anisotropy and reduce the cell switching field. By forming layer 5 with the shape anisotropy directed generally perpendicular to the magnetic anisotropy the magnetic switching field required to switch magnetic vector 6 from the position illustrated to a position rotated 180° is reduced by at least 5 to 50 Oersteds.

The direction of the magnetic anisotropy of layer 5 can be determined in a variety of ways but the simplest is to apply a magnetic field to layer 5 during the formation. Generally, layer 5 will be formed on a supporting layer or substrate by deposition, generally through any of the many evaporation techniques presently performed in the semiconductor art. That is, a blanket layer of magnetic material (not shown) is deposited in the presence an applied magnetic field directed in a selected direction, which in this embodiment is parallel to the width W. Through standard patterning and etching techniques magnetic layer 5 is formed from the blanket layer with the shape anisotropy directed generally perpendicular to the magnetic anisotropy. It will be understood that since the energy density expressions include sine waves, minor variations of a few degrees in $\theta$ will still result in the cell switching field being reduced.

Figure 2:
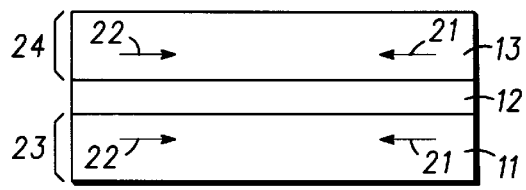
FIG. 2 is a simplified side view of a multi-layer magnetic memory cell incorporating two layers of magnetic material similar to that illustrated in FIG. 1.

Referring now to FIG. 2, an enlarged, simplified side view of a magnetic memory cell 10 having multiple layers that are ferromagnetically coupled. Cell 10 includes a first magnetic layer 11 and a second magnetic layer 13, which are separated by a first non-magnetic spacer layer 12. In this embodiment, each of layers 11 and 13 are formed with the shape anisotropy directed generally perpendicular to the magnetic anisotropy, as explained above with reference to Layer 5. Additionally, layer 11 has a thickness 23 and layer 13 has a thickness 24 that is the same as or greater than thickness 23.

Figure 3:
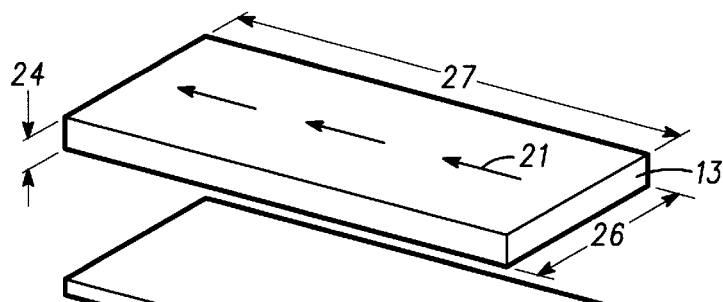
FIG. 3 is a simplified exploded view of the multi-layer magnetic memory cell illustrated in FIG. 2.
Figure 3:
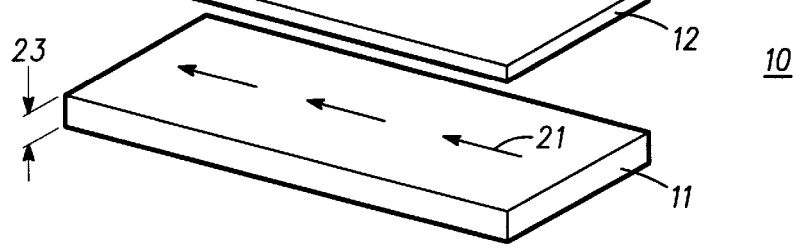

Referring to FIG. 3, an enlarged exploded view of cell 10 is illustrated. Portions of FIG. 3 that have the same reference numbers as FIG. 2 are the same as the corresponding FIG. 2 elements. Layers 11 and 13 are generally rectangular and are formed with the easy axis of magnetization along a length 27 and not along a width 26, that is, the shape anisotropy easy axis is along the length 27. Also, layers 11 and 13 each have magnetic anisotropy generally parallel with width 26. The shape anisotropy of layers 11 and 13 is represented by magnetization vectors 21 which are positioned substantially along length 27, that is, substantially parallel to length 27, which feature is accomplished by forming the width 26 smaller than the width of the magnetic domain walls or transition width within layers 11 and 13. It should be understood that while the shape anisotropy is directed generally perpendicular to the magnetic anisotropy in each of layers 11 and 13 in this embodiment, an improvement in the magnetic switching field would be realized if only layer 11 or 13 were formed with the magnetic anisotropy directed generally perpendicular to the shape anisotropy.

As illustrated in FIG. 2, vectors 21 and 22 in layers 11 and 13 represent two different states of magnetization within cell 10. It should be understood that these are the same vectors and that they are given different numbers only to indicate different states. One state is referred to as a logic "0" and the other state is a logic "1". While it will be understood by those skilled in the art that any logic definition can be assigned to either state, in this explanation when vectors 21 of layers 11 and 13 both point to the left in FIG. 2, cell 10 is in a logic "0" state and when vectors 22 in both layers 11 and 13 are in the opposite direction cell 10 is in a logic "1" state. Thus, for a first state magnetization vectors in both layers 11 and 13 point in a first direction and for a second state magnetization vectors in both layers 11 and 13 point in an opposite direction. Also, because layers 11 and 13 are ferromagnetically coupled (in this embodiment) the magnetic vectors of layers 11 and 13 are always pointing in the same direction (parallel) when no (or a very small) magnetic field is applied to cell 10. The magnetic vectors are only pointing in opposite directions (antiparallel) when specific magnetic fields are applied to cell 10, as will be explained in more detail presently.

It should be understood by those skilled in the art that the structure of the present invention can be operated with modes other than the ferromagnetic mode, which is utilized herein for purposes of explanation only. Two examples are the antiferromagnetic mode and the spin valve mode. In the antiferromagnetic mode, the resting states of the two magnetic layers 11 and 13 are either clock-wise or anti-clockwise antiparallel orientations of vectors 21 and 22. These two states can be used as logic "0" and logic "1"states. In the spin valve mode, one of the layers 11 and 13 is normally pinned and the other layer can be switched to be either parallel or antiparallel to the pinned layer. The parallel and antiparallel states of vectors 21 and 22 can be used as logic "0" and logic "1" states.

In this specific example, cell 10 is designed with layer 13 thinner than layer 11 so that a smaller magnetic field will switch the magnetization vectors of layer 13 than is required to switch the magnetization vectors of layer 11. Another way to accomplish this design is to form layer 11 out of magnetic material that requires a higher magnetic field to switch the magnetization vectors.

The provision of electrically insulating non-magnetic layer 12 between ferromagnetic layers 11 and 13 produces a tunneling junction which allows a flow of current perpendicularly through layer 12, from layer 11 to layer 13 (or vice versa). Essentially, cell 10 appears as a relatively high impedance (herein referred to as a resistance R), generally several thousand ohms, e.g. 5 to 6 kohms. When the magnetization vectors in layers 11 and 13 are antiparallel the resistance R of cell 10 remains very high. When the magnetization vectors in layers 11 and 13 are parallel, the resistance R of cell 10 drops perceptibly. The ratio of the high resistance when the vectors are antiparallel to the low resistance when the vectors are parallel is known as the GMR ratio. The GMR ratio is generally used to sense the state of the cell and the higher the GMR ratio is the easier it is to sense the stored state. It should be understood that a tunneling junction is described herein for purposes of explanation only and the present invention can be used with any of the various types of GMR cells.

Figure 4:
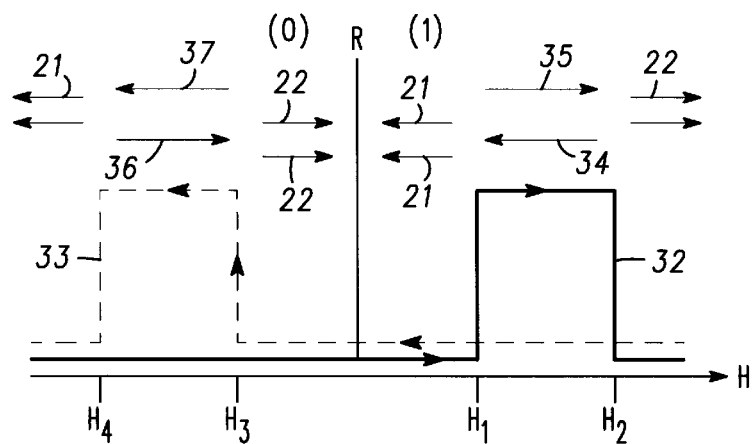
FIG. 4 is a graph illustrating characteristics of the cell of FIG. 2.

Referring specifically to FIG. 4, a graph is illustrated showing the resistance of cell 10 versus different directions of orientation for the magnetic vectors in layers 11 and 13. Also, the direction and strength of an applied magnetic field, required to achieve the various vector directions is shown. The abscissa of the graph indicates magnetic field direction and strength and the ordinate represents the resistance of cell 10. Further, a first curve 32 indicates the cell resistance which can be achieved for the application of various strengths of a magnetic field in a first direction and curve 33 indicates the cell resistance which can be achieved for the application of various strengths of a magnetic field in a second direction. Vectors 34 and 35 are illustrated with curve 32 and represent the magnetic vectors in layers 11 and 13, respectively, for the application of a magnetic field between values $H_1$ and $H_2$ in the positive direction along the abscissa. Similarly, vectors 36 and 37 are illustrated with curve 33 and represent the magnetic vectors in layers 11 and 13, respectively, for the application of a magnetic field between values $H_3$ and $H_4$ in the negative direction along the abscissa.

In a typical submicron cell (e.g. cell 10), the shape anisotropy can make the cell switch at a field of 50 Oersteds or so for each magnetic layer in the cell. The magnetic anisotropy field ranges from 6 to 40 Oersteds per magnetic layer, depending upon the composition of the magnetic material. Thus, directing the magnetic anisotropy easy axis generally perpendicular to that of the shape anisotropy so that they substantially subtract results in a substantial reduction in the magnetic switching field. Here it should be noted that forming layers 11 and 13 as described above, i.e. with the magnetic anisotropy easy axis directed generally perpendicular to that of the shape anisotropy, the values along the abscissa of the curves illustrated in FIG. 4 are shifted toward the perpendicular axis (i.e. the ordinate) by at least 5 to 50 Oersteds while the resistance values, represented by the ordinate, remain substantially constant. It should be understood that since the expressions describing the shape anisotropy and the magnetic anisotropy include sine waves, minor variations of a few degrees in θ will still result in the cell switching field being substantially reduced.

Assuming cell 10 is in the state in which vectors 21 both point to the left, moving to the right along the abscissa, the magnetic field increases up to a value $H_1$. Before the value $H_1$ is reached, magnetic vectors 21 are oriented in the same direction, designated a logic "1", and the resistance of cell 10 is low. Upon applying sufficient magnetic field to cell 10, herein designated by the value $H_1$, vector 35 switches to an opposite direction (as shown) and the resistance of cell 10 increases perceptibly. The amount of this increase is equivalent to the GMR ratio. As the magnetic field is increased beyond a value $H_2$ vector 34 also switches to an opposite direction and the resistance of cell 10 again drops to a low value with the magnetic vectors now being represented by vectors 22. Similarly, if the magnetic field is applied in the opposite direction curve 33 applies and magnetic vector 37 of layer 13 switches at a value $H_3$ and the magnetic vector 36 of layer 11 switches at a value $H_4$, with the magnetic vectors now being represented by vectors 21. In this embodiment, once the vectors of layers 11 and 13 are set in the orientation depicted by vectors 21 or 22 they will remain in that orientation, even after the applied magnetic field is removed, until a magnetic field sufficiently strong to switch them is applied.

Therefore, in this example and assuming that the magnetization vectors of layer 11 are set in the orientation indicated by curve 32 (vector 34) the cell can be set to a logic "0"(parallel magnetization vectors pointing right in FIG. 3) by applying a field with a strength greater than $H_2$. Also, the cell can be set to a logic "1" (parallel magnetization vectors pointing left in FIG. 3) by applying a magnetic field greater than $H_4$. Thus, by reducing the magnetic field strength of $H_2$ and $H_4$ the energy required to write values in cell 10 is substantially reduced.

The following procedure can be used to read stored states in magnetic memory cell 10. Assuming that the vectors of layers 11 and 13 are set in the orientation indicated by curve 33 (vectors 22), applying a positive magnetic field to cell 10 (either $H_1$ or $H_2$) has no effect, which is an indication that the cell has a logic "0"stored therein. Conversely, applying a negative magnetic field to cell 10 between the values $H_4$ and $H_3$, will cause the magnetic vector in layer 13 to switch (vectors 36 and 37) to an antiparallel position and the substantial change in resistance of the cell (generally equivalent to the GMR ratio) can be detected as described above. In a similar fashion, when vectors of layers 11 and 13 are set in the orientation indicated by curve 32 (vectors 21), applying a negative magnetic field to cell 10 (either $H_3$ or $H_4$) has no effect indicating that the cell has a logic "1" stored therein. Conversely, applying a positive magnetic field to cell 10 between the values $H_1$ and $H_2$, will cause the magnetic vector in layer 13 to switch (vectors 34 and 35) to an antiparallel position and the substantial change in resistance of the cell is easily detected.

Thus, by reducing the magnetic field strength of $H_2$ and $H_4$ the energy required to write values in cell 10 is substantially reduced. Further, by reducing the magnetic field strength of $H_1$ and $H_2$ and of $H_3$ and $H_4$ the energy required to read values stored in cell 10 is substantially reduced. Since the magnetic fields required for switching and/or reading are substantially reduced, the cells will consume less power. The power saved is especially large in large arrays, such as in larger MRAM devices.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A low switching field multi-state, multi-layer magnetic memory cell comprising:

two layers of magnetic material stacked in parallel, overlying relationship and separated by a layer of non-magnetic material so as to form a portion of a multi-layer magnetic memory cell, the two layers of magnetic material having a length and a width;

the width of the two layers of magnetic material being less than the length and less than a width of magnetic domain walls within the two layers of magnetic material setting a shape anisotropy easy axis along the length thereof; and at least one of the two layers of magnetic material having a magnetic anisotropy generally parallel to the width of the two layers of magnetic material, and wherein the cell is one of an in-plane type and a tunneling type of magnetic random access memory.

2. A low switching field multi-state, multi-layer magnetic memory cell as claimed in claim 1 wherein the two layers of magnetic material are separated by a layer of non-magnetic material which is electrically conductive.

3. A low switching field multi-state, multi-layer magnetic memory cell as claimed in claim 1 wherein the two layers of magnetic material are separated by a layer of non-magnetic material which is an electrical insulator.

4. A low switching field multi-state, multi-layer magnetic memory cell including first and second layers of magnetic material with a layer of non-magnetic material sandwiched therebetween, at least one of the first and second layers of magnetic material having a shape anisotropy generally described by the expression $K_D \sin^2\theta$ and a magnetic anisotropy generally described by the expression $-K_m \sin^2\theta$, where $K_m$ is a magnetic anisotropy energy density, $K_D$ is a demagnetization energy density, and $\theta$ is an angle between the shape anisotropy easy axis and the magnetization vector.

5. A low switching field multi-state, multi-layer magnetic memory cell comprising:

a plurality of layers of magnetic material stacked in parallel, overlying relationship and separated by layers of non-magnetic material so as to form a multi-layer magnetic memory cell having a length and a width;

the width of the multi-layer magnetic memory cell being less than the length and less than a width of magnetic domain walls within the layers of magnetic material setting a shape anisotropy easy axis along the length of the multi-layer magnetic memory cell; and at least one of the plurality of layers of magnetic material having an easy axis magnetic anisotropy generally parallel to the width of the multi-layer magnetic memory cell, and wherein the cell is one of an in-plane type and a tunneling type of magnetic random access memory.

6. A low switching field multi-state, multi-layer magnetic memory cell as claimed in claim 5 wherein at least two layers of the plurality of layers of magnetic material are separated by a layer of non-magnetic material which is electrically conductive.

7. A low switching field multi-state, multi-layer magnetic memory cell as claimed in claim 5 wherein at least two layers of the plurality of layers of magnetic material are separated by a layer of non-magnetic material which is an electrical insulator.

8. A low switching field multi-state, multi-layer magnetic memory cell comprising:

a plurality of layers of magnetic material stacked in parallel, overlying relationship and separated by layers of non-magnetic material so as to form a multi-layer magnetic memory cell having a length and a width;

the width of the multi-layer magnetic memory cell being less than the length and less than a width of magnetic domain walls within the layers of magnetic material setting a shape anisotropy easy axis along the length of the multi-layer magnetic memory cell; and at least one of the plurality of layers of magnetic material having an easy axis magnetic anisotropy generally parallel to the width of the multi-layer magnetic memory cell, and wherein the cell is formed with a shape anisotropy generally described by the expression $K_D \sin^2\theta$ and a magnetic anisotropy generally described by the expression $-K_m \sin^2\theta$, where $K_m$ is a magnetic anisotropy energy density, $K_D$ is a demagnetization energy density, $\theta$ is an angle between the shape anisotropy easy axis and the magnetization vector.

* * * * *

UNITED STATES PATENT AND TRADEMARK OFFICE
CERTIFICATE OF CORRECTION

PATENT NO.    : 5,917,749                                              Page 1 of 1
DATED         : June 29, 1999
INVENTOR(S)   : Chen et al.

It is certified that error appears in the above-identified patent and that said Letters Patent is hereby corrected as shown below:

<u>Column 1,</u>
Line 3, after the Title, please add as a new first paragraph the following paragraph:
    -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*